United States Patent
Toyoda et al.

(10) Patent No.: US 6,833,599 B2
(45) Date of Patent: Dec. 21, 2004

(54) SENSITIVITY ENHANCEMENT OF SEMICONDUCTOR MAGNETIC SENSOR

(75) Inventors: Inao Toyoda, Anjo (JP); Noboru Endo, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/374,085

(22) Filed: Feb. 27, 2003

(65) Prior Publication Data

US 2003/0160291 A1 Aug. 28, 2003

(30) Foreign Application Priority Data

Feb. 28, 2002 (JP) ........................................ 2002-054404

(51) Int. Cl.[7] .......................... H01L 29/82; H01L 43/00
(52) U.S. Cl. ........................ 257/425; 257/421; 257/422; 257/423; 257/424; 257/426; 257/427; 438/48; 73/779
(58) Field of Search ................................ 257/421–427; 438/48; 73/779; 324/249, 252

(56) References Cited

U.S. PATENT DOCUMENTS

| | | | |
|---|---|---|---|
| 4,129,880 A | | 12/1978 | Vinal |
| 4,163,986 A | * | 8/1979 | Vinal ........................ 257/252 |
| 5,528,067 A | | 6/1996 | Farb |

FOREIGN PATENT DOCUMENTS

JP 58-42282 3/1983

OTHER PUBLICATIONS

"A High–Resolution Integrated Magnetic Sensor Using Chopper–Stabilized Amplification" Technical Digest of the 12th Sensor Symposium, 1994 pp. 205–208 (Discussed on p. 1 of the specification.).

* cited by examiner

*Primary Examiner*—Donghee Kang
(74) *Attorney, Agent, or Firm*—Posz & Bethards, PLC

(57) ABSTRACT

A semiconductor magnetic sensor includes a semiconductor substrate, a source, a drain, a gate, and a carrier condensing means. The source and the drain are located in a surface of the substrate. One of the source and the drain includes adjoining two regions. The gate is located between the source and the drain for drawing minority carriers of the substrate to induce a channel, through which the carriers flow between the source and the drain to form a channel carrier current. The carriers flow into the two regions to form two regional carrier currents. The magnitude of a magnetic field where the sensor is placed is measured using the difference in quantity between the two regional carrier currents. The carrier condensing means locally increases carrier density in the channel carrier current in the proximity of an axis that passes between the two regions in order to increase the difference.

3 Claims, 5 Drawing Sheets

SENSITIVITY ENHANCEMENT OF SEMICONDUCTOR MAGNETIC SENSOR

CROSS REFERENCE TO RELATED APPLICATION

This application is based on and incorporates herein by reference Japanese Patent Application No. 2002-54404 filed on Feb. 28, 2002.

BACKGROUND OF THE INVENTION

The present invention relates to a semiconductor magnetic sensor that measures the magnitude of a magnetic field.

Such a semiconductor magnetic sensor is disclosed in, for example, "A High-Resolution Integrated Magnetic Sensor Using Chopper-Stabilized Amplification," (Technical Digest of the $12^{th}$ Sensor Symposium, 1994, pages 205–208).

As shown in FIG. 1A, the semiconductor magnetic sensor 6 of the publication has an n channel MOSFET structure. The sensor 6 includes a p-type semiconductor substrate 5, a source 1, a drain 2, a gate insulating film 4, and a gate 3. The source 1 is located in a surface of the substrate 5 and further includes a first $n^+$ source region 1a and a second $n^+$ source region 1b. The drain 2 is also located in the surface of the substrate 5 and further includes a first $n^+$ drain region 2a and a second $n^+$ drain region 2b. The gate insulating film 4 is made of, for example, silicon oxide and located on the surface of the substrate 5 between the source 1 and the drain 2. A channel region 9, where a channel is induced for electrically connecting the source 1 and the drain 2, is located between the source 1 and the drain 2 at the surface of the p-type semiconductor substrate 5.

As shown in FIG. 1B, a constant current circuit 7 supplies constant currents of same magnitudes to the two $n^+$ drain regions 2a, 2b using wiring lines that are electrically connected to the drain regions 2a, 2b through two drain contact holes. The currents flowing through the $n^+$ source regions 1a, 1b respectively flow into two wiring lines that are electrically connected to the source regions 1a, 1b through two source contact holes. The currents flowing in the wiring lines connected to the source regions 1a, 1b are measured using current sensors 8. The difference between the currents is calculated. The magnitude of a magnetic field where the sensor is placed is measured on the basis of the difference between the currents, which is generated according to the following mechanism.

When the sensor 6 is not in a magnetic field, the number of the carriers that flow per unit time from the first source area 1a to the first drain area 2a is substantially equal to that from the second source area 1b to the second drain area 2b. However, when the sensor 6 is placed in a magnetic field that is orthogonal to the surface of the substrate 5, the carriers that flow through the channel, which is induced in the channel region 9 using the gate 3, are deflected due to the Lorentz force. As a result, for example, some of the carriers flow from the second source region 1b into the first drain region 2a, as shown in FIG. 1C. Therefore, the difference between the currents is generated. In other words, in the sensor 6, the difference between the currents is generated due to the Hall effect.

However, in the sensor 6, the carriers that flow in the median area of the carrier current mainly contribute to the difference between the currents. Therefore, the difference between the currents is relatively small, and the sensitivity of the sensor 6 of the publication is not satisfactory enough.

SUMMARY OF THE INVENTION

The present invention has been made in view of the above aspects with an object to enhance the sensitivity of a semiconductor magnetic sensor by increasing the difference between the currents that vary in response to the magnitude of a magnetic field where the sensor is placed.

To achieve the above object, a semiconductor magnetic sensor according to the present invention includes a semiconductor substrate, a source, a drain, a gate, and a carrier condensing means. The source and the drain are located in a surface of the substrate. One of the source and the drain includes adjoining two regions. The gate is located between the source and the drain for drawing minority carriers of the substrate to induce a channel, through which the carriers flow between the source and the drain to form a channel carrier current. The carriers flow out of the channel into the two regions to form two regional carrier currents. The magnitude of a magnetic field where the sensor is placed is measured using the difference in quantity between the two regional carrier currents. The carrier condensing means locally increases carrier density in the channel carrier current in the proximity of an axis that passes between the two regions in order to increase the difference in quantity between the two regional carrier currents.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 2A:
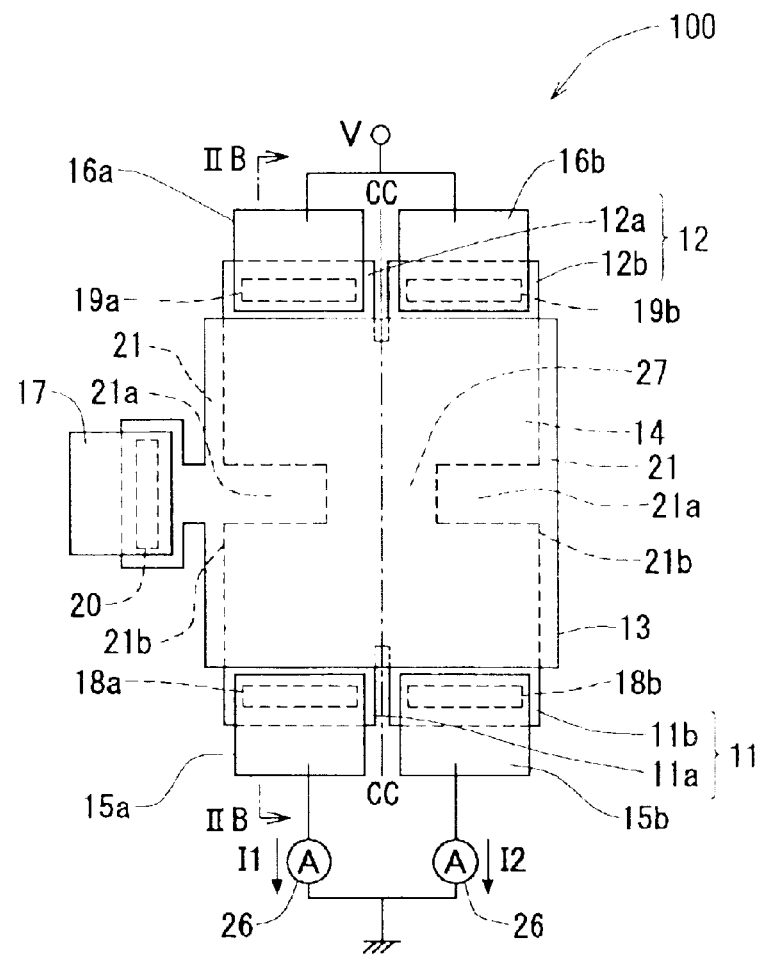
FIG. 2A is a schematic plan view of a semiconductor magnetic sensor according to a first embodiment of the present invention.
Figure 2B:
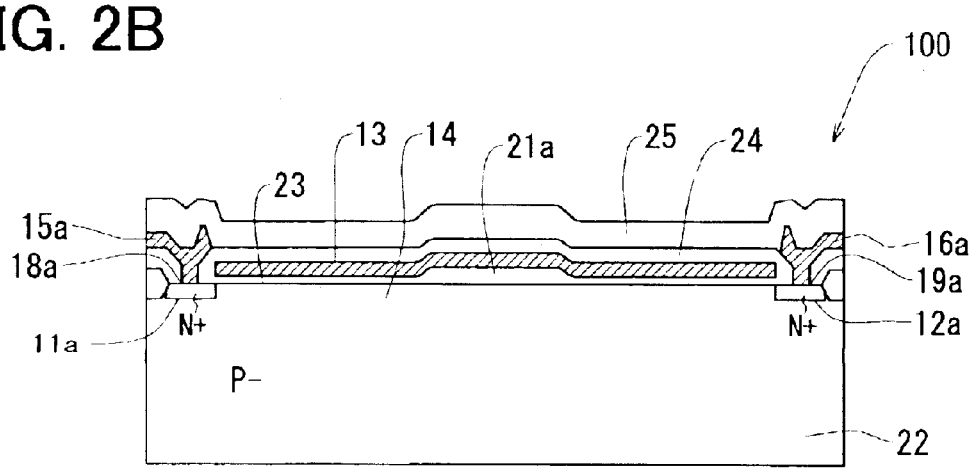
FIG. 2B is a cross-sectional view of the sensor in FIG. 2A taken along the line IIB—IIB in FIG. 2A.

The present invention will be described in detail with reference to various embodiments.
First Embodiment
As shown in FIGS. 2A and 2B, the semiconductor magnetic sensor 100 according to a first embodiment has an n channel MOSFET structure. The sensor 100 includes a p-type semiconductor substrate 22, a source 11, a drain 12, a gate insulating film 23 (first insulating film), two LOCOS oxide films 21 (second insulating film), and a gate 13. The source 11 is located in a surface of the substrate 22 and further includes a first n+ source region 11a and a second n+ source region 11b. The drain 12 is also located in the surface of the substrate 22 and further includes a first n+ drain region 12a and a second n+ drain region 12b. The gate insulating film 23 is made of, for example, silicon oxide and located on the surface of the substrate 22 between the source 11 and the drain 12.

A channel region 14 is located between the source 11 and the drain 12 in the surface of the p-type semiconductor substrate 22. When in use, a channel 14 is induced in the channel region 14 using the gate 13 to form a channel carrier current that flows in the channel 14 for electrically connecting the source 11 and the drain 12. The channel carrier current flows out of the channel 14 into the two drain regions 12a, 12b to form two regional carrier currents.

In FIG. 2A, a silicon oxide film 24, which is an interlayer insulating film, and a silicon nitride 25, which is a passivation film, are not shown for the purpose of clarifying characteristics in the structure of the sensor 100. In addition, an axis CC—CC is illustrated that passes between the drain regions 12a, 12b and between the source regions 11a, 11b. The sensor 100 of FIGS. 2A and 2B may be manufactured using a known standard process for manufacturing MOSFETs, so no explanation on the manufacturing process for the sensor 100 is made.

The first and second source regions 11a, 11b are in substantially the same dimensions and adjoin. The first source region 11a is electrically connected to a first source wiring line 15a through a first source contact hole 18a. On the other hand, the second source region 11b is electrically connected to a second source wiring line 15b through a second source contact hole 18b. Each of the source wiring lines 15a, 15b is connected to a current sensor 26. A first current I1 and a second current I2, which respectively flow through the source wiring lines 15a, 15b, are measured using the current sensors 26. The magnitude of a magnetic field where the sensor 100 is placed is measured on the basis of the difference in quantity between the first current I1 and the second current I2

The first and second drain regions 12a, 12b are in substantially the same dimensions and adjoin. The first drain region 12a is electrically connected to a first drain wiring line 16a through a first drain contact hole 19a. On the other hand, the second drain region 12b is electrically connected to a second drain wiring line 16b through a second drain contact hole 19b. The drain wiring lines 16a, 16b are connected to a common power supply to apply a substantially equal voltage to the drain regions 12a, 12b.

The gate 13 is rectangular and electrically connected to a gate wiring line 17 through a gate contact hole 20. Although not shown in the figure, the gate wiring line 17 is connected to a bias voltage source for drawing minority carriers of the substrate 22 by applying a bias voltage to the gate 13 to induce the channel 14 in the channel region 14.

As shown in FIGS. 2A and 2B, the gate insulating film 23 is located under the gate 13 and thin enough to permit the gate 13 to induce the channel 14, so the dimensions of the channel region 14, or the dimensions of the channel 14, is substantially defined by the dimensions of the gate insulating film 23. On the other hand, the LOCOS oxide films 21, each of which has an outline 21b, are located under the gate 13 and so thick that no channel is induced under the LOCOS oxide films 21 when the bias voltage is applied to the gate 13. Therefore, the dimensions of the gate insulating film 23 can be defined by the shape of the outlines 21b, as shown in FIG. 2A.

Each of the LOCOS oxide film 21 includes extruding part 21a to form a neck 27 in the channel region 14. The channel region 14 is locally narrow at the neck 27. In other word, the channel 14, which is induced in the channel region 14, has a neck 27 at which the carriers that flow in the channel 14 are condensed. In addition, the extruding parts 21a are symmetrical with respect to the axis CC—CC. The axis CC—CC passes through the neck 27 of the channel 14, and the neck 27 of the channel 14 is symmetrical with respect to the axis CC—CC, as shown in FIG. 2A.

The carriers in the channel carrier current flow without being deflected from the first source region 11a toward the corresponding first drain region 12a and from the second source region 11b toward the corresponding second drain region 12b, when the sensor 100 is not in a magnetic field. In addition, the first and second source regions 11a, 11b are in substantially the same dimensions and adjoin. The first and second drain regions 12a, 12b are also in substantially the same dimensions and adjoin. The channel 14 is symmetrical with respect to the axis CC—CC, as shown in FIG. 2A. Therefore, the two regional carrier currents are substantially equal to each other. As a result, there is substantially no difference in quantity between the first current I1 and the second current I2, when the sensor 100 is not in a magnetic field.

When the sensor 100 is placed in a magnetic field that is orthogonal to the surface of the substrate 22, the carriers in the channel carrier current are deflected due to the Lorentz force. As a result, some of the carriers flow from the second source region 11b into the first drain area 12a or flow from the first source region 11a into the second drain region 12b. Therefore the two regional carrier currents become different from each other, and the difference between the currents I1, I2 is generated.

In the sensor 100 of FIGS. 2A and 2B, the channel 14 is locally narrow at the neck 27, which is formed using the extruding parts 21a at the middle area of the channel. In addition, the axis CC—CC passes through the neck 27 of the channel and the neck 27 of the channel is substantially symmetrical with respect to the axis CC—CC, as shown in FIG. 2A, so the carriers that flow in the channel 14 are condensed in the proximity of the axis CC—CC at the neck 27. As a result, more carriers contribute to make the difference in quantity between the two regional carrier currents in the channel 14 of the sensor 100 of FIGS. 2A and 2B than that in the proposed sensor of FIG. 1A under the same magnitude of the magnetic field to be detected. Therefore, the sensor 100 of FIGS. 2A and 2B has higher detection sensitivity with respect to the magnetic field to be detected than the proposed sensor of FIG. 1A.

If the entire channel 14 were narrow along the channel carrier current, the conductance of the channel 14 would decrease and fewer carriers would flow through the channel 14. In the sensor 100, however, the channel 14 is locally narrow at the middle area of the channel 14, and the channel 14 is wide at two ends thereof that are respectively close to the source 11 and the drain 12. As a result, the carrier density is efficiently increased in the proximity of the axis CC—CC at the neck 27 with the conductance reduction of the channel suppressed.

Second Embodiment

Figure 3:
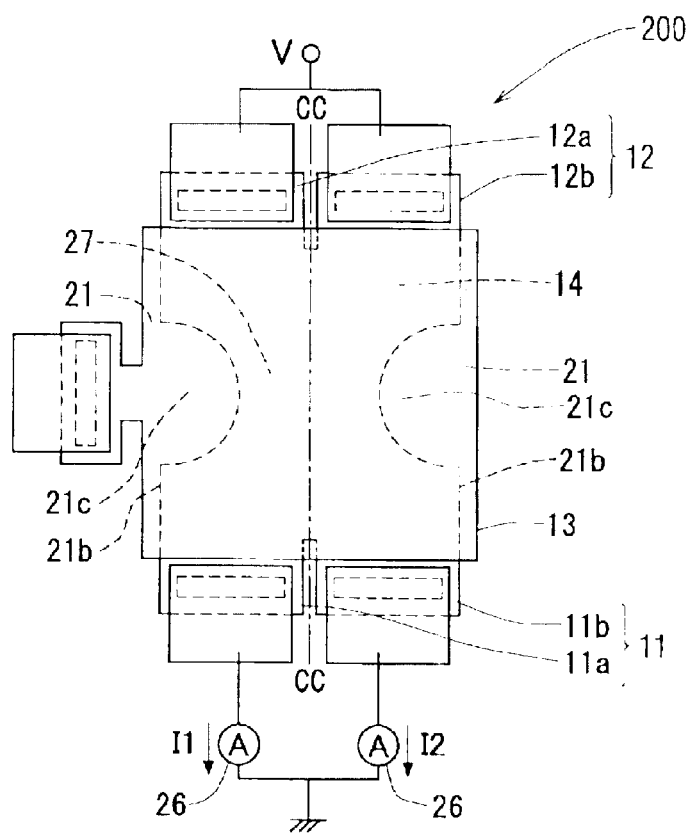
FIG. 3 is a schematic plan view of a semiconductor magnetic sensor according to a second embodiment.

As shown in FIG. 3, a semiconductor magnetic field sensor 200 according to a second embodiment differs from the sensor 100 of FIGS. 2A and 2B in the dimensions of the channel 14. The sensor 200 of FIG. 3 includes two LOCOS oxide films 21, each of which includes an extruding part 21c that is substantially semicircular. Therefore, a channel 14, the dimensions of which are substantially defined by outlines 21b of the LOCOS oxide films 21, continuously narrows at the carrier flow intake of a neck 27 and continuously widens at the carrier flow outlet of the neck 27.

In the sensor 100 of FIGS. 2A and 2B, each extruding part 21a is rectangular and has two sharp corners at an end close to the axis CC—CC. That is, the channel 14 discontinuously narrows at the neck 27. Therefore, the carrier density in the carrier flow sharply increases at the carrier flow intake of the neck 27 and sharply decreases at the carrier flow outlet of the neck 27. Thus, the distribution of the carrier density at the neck 27 is susceptible to the deviation in the dimensions of the extruding parts 21a in production. Accordingly, the difference between the two regional carrier currents when the magnitude of the magnetic field is zero is also susceptible to the deviation in the dimensions of the extruding parts 21a in production.

In contrast, in the sensor 200 of FIG. 3, the channel 14 continuously narrows at the carrier flow intake of the neck 27 and continuously widens at the carrier flow outlet of the neck 27. Therefore, the carrier density in the carrier flow gradually increases at the carrier flow intake of the neck 27 and gradually decreases at the carrier flow outlet of the neck 27. Thus, the distribution of the carrier density at the neck 27 is less susceptible to the deviation in the dimensions of the extruding parts 21c in production. As a result, it is facilitated to equalize the two regional carrier currents when the magnitude of the magnetic field is zero.

Third Embodiment

Figure 4:
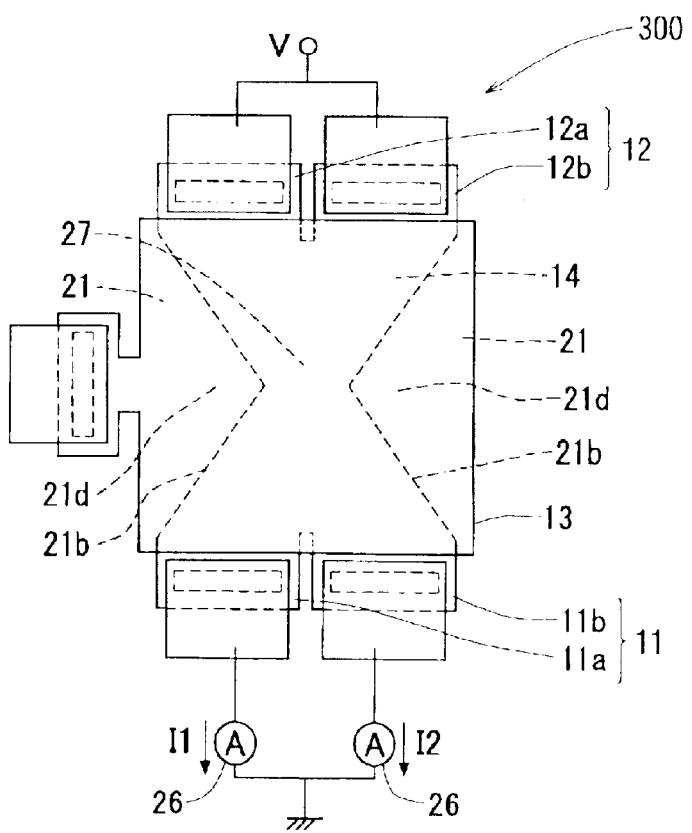
FIG. 4 is a schematic plan view of a semiconductor magnetic sensor according to a third embodiment.

As shown in FIG. 4, a semiconductor magnetic field sensor 300 according to a third embodiment differs from the sensor 100 of FIGS. 2A and 2B in the dimensions of the channel 14. The sensor 300 of FIG. 4 includes two LOCOS oxide films 21, each of which includes an extruding part 21d that is substantially triangular. Therefore, the channel 14 continuously narrows at the carrier flow intake of the neck 27 and continuously widens at the carrier flow outlet of the neck 27. Accordingly, the carrier density in the carrier flow gradually increases at the carrier flow intake of the neck 27 and gradually decreases at the carrier flow outlet of the neck 27. Thus, the distribution of the carrier density at the neck 27 is less susceptible to the deviation in the dimensions of the extruding parts 21d in production. As a result, it is facilitated to equalize the two regional carrier currents when the magnitude of the magnetic field is zero.

Fourth Embodiment

Figure 5A:
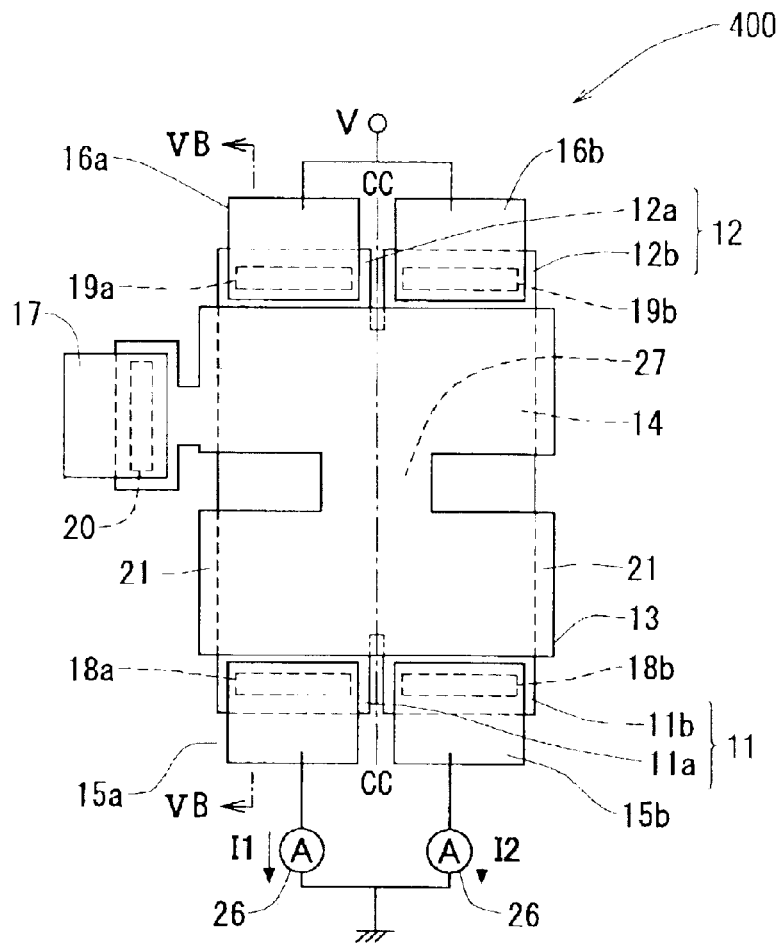
FIG. 5A is a schematic plan view of a semiconductor magnetic sensor according to a fourth embodiment.
Figure 5B:
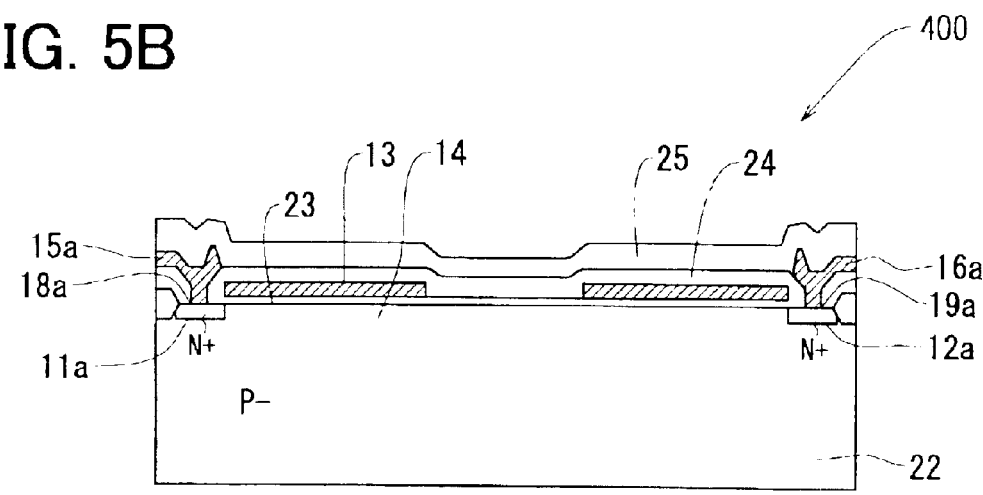
FIG. 5B is a cross-sectional view of the sensor in FIG. 5A taken along the line VB—VB in FIG. 5A.

As shown in FIGS. 5A and 5B, a semiconductor magnetic field sensor 400 according to a fourth embodiment differs from the sensor 100 of FIGS. 2A and 2B in the dimensions of the gate 13 and the two LOCOS oxide films 21. In the sensor 100, the neck 27 is formed in the channel 14 using the gate insulating film 23 and two LOCOS oxide films 21, which include the extruding parts 21a. In contrast, a neck 27 is formed in a channel 14 using a gate 13 in the sensor 400 of FIGS. 5A and 5B.

As shown in FIGS. 5A and 5B, the sensor 400 includes LOCOS oxide films 21 under the gate 13. None of the LOCOS oxide films 21, however, include any extruding part for forming the neck 27. Instead, the gate 13 itself has a neck that would fit the extruding parts 21a of the sensor 100 of FIGS. 2A and 2B. The sensor 400 has an MOSFET structure, so the channel 14 is induced under the gate 13 when a bias voltage is applied to the gate 13. Therefore, the channel 14 that has the neck 27 can be formed using the shape of the gate 13.

Figure 1A:
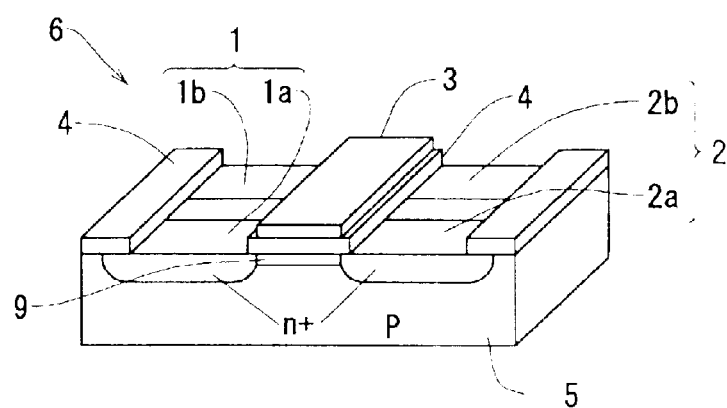
FIG. 1A is a schematic perspective view of a proposed semiconductor magnetic sensor.
Figure 1B:
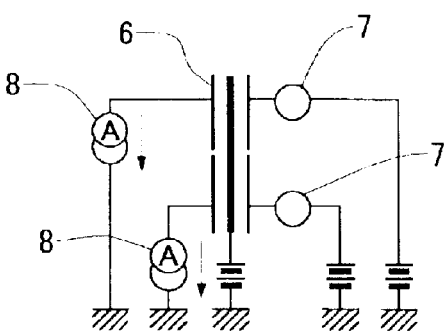
FIG. 1B is a circuit diagram for measuring the magnitude of a magnetic field where the sensor of FIG. 1A is placed.
Figure 1C:
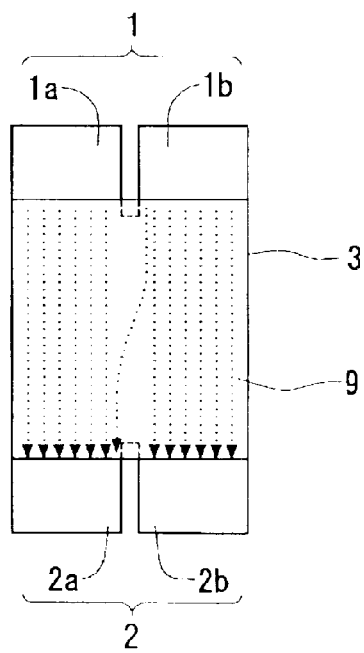
FIG. 1C is a view showing how the carriers flow in the channel.

As a result, more carriers contribute to make the difference in quantity between the two regional carrier currents in the channel 14 of the sensor 400 of FIGS. 5A and 5B than that in the proposed sensor of FIG. 1A under the same magnitude of the magnetic field to be detected. Therefore, the sensor 400 of FIGS. 5A and 5B has higher detection sensitivity with respect to the magnetic field to be detected than the proposed sensor of FIG. 1A.

Fifth Embodiment

Figure 6A:
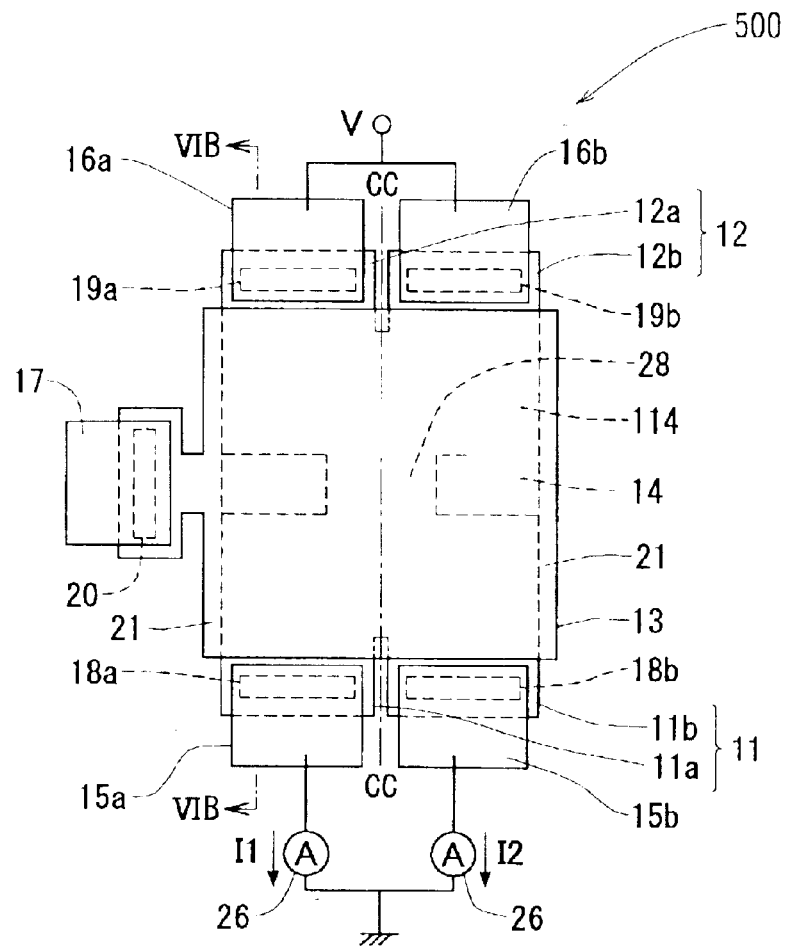
FIG. 6A is a schematic plan view of a semiconductor magnetic sensor according to a fifth embodiment.
Figure 6B:
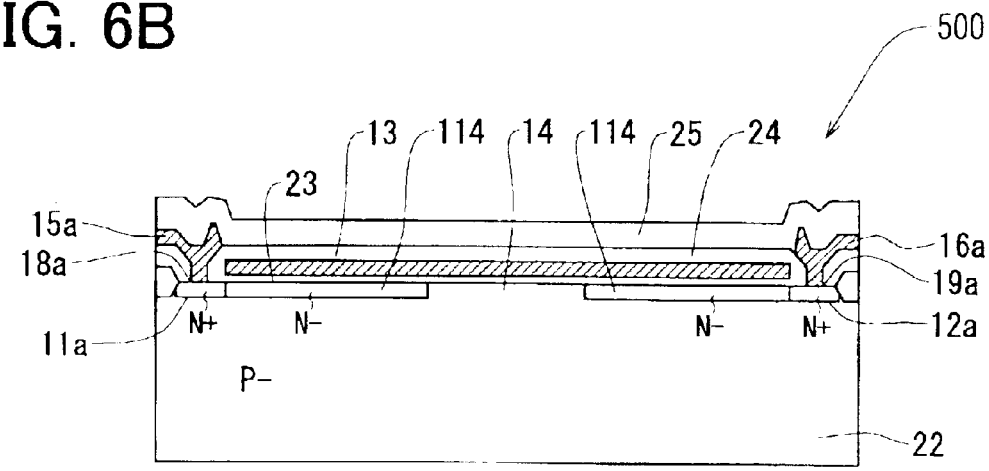
FIG. 6B is a cross-sectional view of the sensor in FIG. 6A taken along the line VIB—VIB in FIG. 6A.

As shown in FIGS. 6A and 6B, a semiconductor magnetic field sensor 500 according to a fifth embodiment differs from the sensor 100 of FIGS. 2A and 2B in the dimensions of the two LOCOS oxide films 21. In addition to that, the sensor 500 is a depletion type MOSFET, and an impurity diffusion region 114 is located in a channel 14.

As shown in FIGS. 6A and 6B, the impurity diffusion region 114 has substantially the same shape as the channel 14 of the sensor 100 in FIG. 2A. That is, the impurity diffusion region 114 has a neck 28, at which the region 114 is locally narrow. Therefore, the carrier density in the carrier flow in the channel 14 is relatively high at the neck 28.

As a result, more carriers contribute to make the difference in quantity between the two regional carrier currents in the channel 14 of the sensor 500 of FIGS. 6A and 6B than that in the proposed sensor of FIG. 1A under the same magnitude of the magnetic field to be detected. Therefore, the sensor 500 of FIGS. 6A and 6B has higher detection sensitivity with respect to the magnetic field to be detected than the proposed sensor of FIG. 1A.

Other Embodiments

In the above sensors 100, 200, 300, 400, 500, each of the source 11 and the drain 12 includes two regions 11a, 11b, 12a, 12b. However, it is also possible that only one of the source 11 and the drain 12 includes two regions 11a, 11b, 12a, 12b. Even in such an instance, the currents to be measured by the current sensors 26 can be separately drawn from the two regions 11a, 11b, 12a, 12b.

The structures used in the sensors 100, 200, 300 of FIGS. 2A to 4 and those used in the sensors 400, 500 of FIGS. 5A to 6B may be used together in any combinations.

In the above sensors 100, 200, 300, 400, 500, a common voltage bias is applied to the first drain region 12a and the second drain region 12b, and the difference between the currents I1, I2 is detected by the current sensors 26. However, it is also possible to measure the magnitude of the magnetic field as follows. Voltage biases are separately applied to the first drain region 12a and the second drain region 12b such that the currents I1, I2 are equalized. Then, the difference between the voltage biases is measured. The magnitude of the magnetic field is measured using the difference between the voltage biases.

Although the above sensors 100, 200, 300, 400, 500 have an n channel MOSFET structure, it goes without saying that a p channel MOSFET structure may also be used instead.

What is claimed is:

1. A semiconductor magnetic sensor comprising:
   a semiconductor substrate;
   a source, which is located in a surface of the substrate;
   a drain, which is located in a surface of the substrate, wherein one of the source and the drain includes adjoining two regions;
   a gate, which is located between the source and the drain for drawing minority carriers of the substrate to induce a channel, through which the carriers flow between the source and the drain to form a channel carrier current, wherein the carriers flow out of the channel into the two regions to form two regional carrier currents, and wherein the magnitude of a magnetic field where the sensor is placed is measured using the difference in quantity between the two regional carrier currents; and a carrier condensing means for locally increasing carrier density in the channel carrier current in the proximity of an axis that passes between the two regions in order to increase the difference in quantity between the two regional carrier currents, wherein the channel has a neck, at which the channel is locally narrow and the carriers are condensed, and wherein the neck is formed using the carrier condensing means such that the axis passes through the neck, and wherein the neck is located in a substantially middle area of the channel, wherein the channel is wider at two ends thereof that are respectively close to the source and the drain to efficiently increase the carrier density at the neck with a conductance reduction of the channel suppressed.

2. A semiconductor magnetic sensor comprising:

a semiconductor substrate;

a source, which is located in a surface of the substrate;

a drain, which is located in a surface of the substrate, wherein one of the source and the drain includes adjoining two regions;

a gate, which is located between the source and the drain for drawing minority carriers of the substrate to induce a channel, through which the carriers flow between the source and the drain to form a channel carrier current, wherein the carriers flow out of the channel into the two regions to form two regional carrier currents, and wherein the magnitude of a magnetic field where the sensor is placed is measured using the difference in quantity between the two regional carrier currents; and a carrier condensing means for locally increasing carrier density in the channel carrier current in the proximity of an axis that passes between the two regions in order to increase the difference in quantity between the two regional carrier currents, wherein the channel has a neck, at which the channel is locally narrow and the carriers are condensed, and wherein the neck is formed using the carrier condensing means such that the axis passes through the neck, wherein the adjoining two regions and the channel is substantially symmetric with respect to the axis to equalize the two regional carrier currents when the magnitude of the magnetic is zero, and wherein the channel continuously narrows at a carrier flow intake of the neck and continuously widens at a carrier flow outlet of the neck to facilitate the equalization.

3. A semiconductor magnetic sensor comprising:

a semiconductor substrate;

a source, which is located in a surface of the substrate;

a drain, which is located in a surface of the substrate, wherein one of the source and the drain includes adjoining two regions;

a gate, which is located between the source and the drain for drawing minority carriers of the substrate to induce a channel, through which the carriers flow between the source and the drain to form a channel carrier current, wherein the carriers flow out of the channel into the two regions to form two regional carrier currents, and wherein the magnitude of a magnetic field where the sensor is placed is measured using the difference in quantity between the two regional carrier currents; and a carrier condensing means for locally increasing carrier density in the channel carrier current in the proximity of an axis that passes between the two regions in order to increase the difference in quantity between the two regional carrier currents, wherein the channel has a neck, at which the channel is locally narrow and the carriers are condensed, and wherein the neck is formed using the carrier condensing means such that the axis passes through the neck, and wherein the carrier condensing means is first and second insulating films, wherein the first insulating film is located under the gate to substantially define the dimensions of the channel, wherein the second insulating film is located under the gate, wherein the second insulating film is so thicker than the first insulating film that substantially no channel is induced under the second insulating film, and wherein the second insulating film defines dimensions of the first insulating film such that the channel has the neck.

* * * * *

UNITED STATES PATENT AND TRADEMARK OFFICE
CERTIFICATE OF CORRECTION

PATENT NO. : 6,833,599 B2
DATED : December 21, 2004
INVENTOR(S) : Toyoda et al.

It is certified that error appears in the above-identified patent and that said Letters Patent is hereby corrected as shown below:

Title page,
Item [73], Assignee, replace with: -- Denso Corporation, Kariya-City, Japan --

Signed and Sealed this

Twenty-second Day of March, 2005

JON W. DUDAS
*Director of the United States Patent and Trademark Office*